understand United States Patent [19]

Tanaka et al.

[11] Patent Number: 4,873,177
[45] Date of Patent: Oct. 10, 1989

[54] METHOD FOR FORMING A RESIST PATTERN ON A SUBSTRATE SURFACE AND A SCUM-REMOVER THEREFOR

[75] Inventors: Hatsuyuki Tanaka; Yoshiyuki Sato, both of Samukawa; Hidekatsu Kohara, Chigasaki; Toshimasa Nakayama, Hiratsuka, Japan

[73] Assignee: Tokyo Ohka Kogyo Co., Ltd., Japan

[21] Appl. No.: 229,762

[22] Filed: Aug. 5, 1988

Related U.S. Application Data

[63] Continuation of Ser. No. 15,215, Feb. 17, 1987, abandoned.

[30] Foreign Application Priority Data

Feb. 24, 1986 [JP] Japan .................................. 61-38755
Mar. 17, 1986 [JP] Japan .................................. 61-57162

[51] Int. Cl.$^4$ ........................... G03C 5/24; G03C 5/34
[52] U.S. Cl. .................................... 430/326; 430/309; 430/331
[58] Field of Search ...................... 430/326, 331, 309

[56] References Cited

U.S. PATENT DOCUMENTS

| | | | |
|---|---|---|---|
| 4,239,661 | 12/1980 | Muraoka et al. | 430/331 |
| 4,530,895 | 7/1985 | Simon et al. | 420/326 |
| 4,576,793 | 3/1986 | Kita et al. | 430/331 |
| 4,617,254 | 10/1986 | Kinoshita et al. | 430/326 |

*Primary Examiner*—Paul R. Michl
*Assistant Examiner*—Patrick A. Doody
*Attorney, Agent, or Firm*—Hopgood, Calimafde, Kalil, Blaustein & Judlowe

[57] ABSTRACT

The pattern-wise photoresist layer formed on the surface of a substrate according to the inventive method is imparted with a greatly improved resolving power as a result of complete removal of the scum residua left after the development treatment. Namely, the positive-working photoresist layer formed on the substrate surface is exposed pattern-wise to actinic rays, developed with a developer solution which is typically a 2–7% aqueous solution of a quaternary ammonium hydroxide and then rinsed with a scum-remover solution which is a mixture of 100 parts of a 0.1–1.5% aqueous solution of a quaternary ammonium hydroxide and 1–30 parts of a water-miscible organic solvent and capable of dissolving away the scum residua in the pattern-wise photoresist layer without affecting the quality of the photoresist pattern reproduction.

3 Claims, No Drawings

METHOD FOR FORMING A RESIST PATTERN ON A SUBSTRATE SURFACE AND A SCUM-REMOVER THEREFOR

This application is a continuation of application Ser. No. 015,215, filed 2/17/87, now abandoned.

BACKGROUND OF THE INVENTION

The present invention relates to a method for forming a resist pattern on a substrate surface or, more particularly, to a method for forming, on a substrate surface, a resist pattern having an outstandingly high resolving power without the problem of adhering scums after the development treatment. The invention relates also to a scum-remover used in the method.

As is well known, the techniques utilizing a photoresist composition are widely used for the manufacture of various kinds of precision articles such as integrated circuits, photomasks for the processing of integrated circuits, printed circuit boards, printing plates and the like. The principle of the techniques is that the surface of a substrate is coated with a layer of a photoresist composition and the layer is removed pattern-wise to expose the substrate surface bare only on the areas where the substrate surface should be subjected preferentially to subsequent working such as etching, diffusion of a dopant and so on with the pattern-wise photoresist layer as a protecting mask.

The pattern formation using a photoresist composition is primarily performed by a pattern-wise exposure of the photoresist layer to actinic rays, e.g. ultraviolet light, to cause a change in the solubility of the photoresist composition in a liquid called a developer. Relative to the direction of the change in the solubility of the composition in a developer solution caused by the ultraviolet exposure, photoresist compositions are classified into positive-working and negative-working ones. A positive-working photoresist composition is characterized in the increased solubility of the photoresist layer in the developer by the ultraviolet exposure so that the substrate surface is exposed bare after development on the areas exposed pattern-wise to the ultraviolet leaving the photoresist layer on the unexposed areas. A negative-working photoresist composition, on the contrary, is characterized by the decreased solubility of the photoresist layer in the developer by the pattern-wise exposure to ultraviolet so that the pattern-wise ultraviolet exposure and development result in a pattern-wise photoresist layer left on the unexposed areas.

Various kinds of photoresist compositions have been proposed and are practically used in the industrial production including both of the positive-working and negative-working ones. For example, typical and most widely used positive-working photoresist compositions are formulated with an alkali-soluble novolac resin as a film-forming constituent and a photosensitive constituent to promote the increase in the solubility of the composition by a photo-induced decomposition reaction. The developer used for the development of the photoresist layer formed of such a photosensitive composition after pattern-wise ultraviolet exposure is usually an alkaline aqueous solution. No alkali metal compound, however, can be used as the alkalifying agent of such a developer solution, especially, in the processing of semiconductor devices because contamination of the semiconductor material with alkali metal ions is very detrimental against the performance of the semiconductor devices. Accordingly, the developer for the positive-working photoresist compositions usually contains a water-soluble organic base as the alkalifying agent exemplified by quaternary ammonium hydroxides as taught in IBM Technical Disclosure Bulletin, volume 13, No. 7, page 2009 (1970) and choline as taught in U.S. Pat. No. 4,239,661.

One of the requirements for the developer is the selectivity in solubilization of the photoresist composition after pattern-wise ultraviolet exposure, Namely, an ideal developer for a positive-working photoresist composition should dissolve the composition on the ultraviolet-exposed areas as easily as possible while the composition on the unexposed areas should be left absolutely intact by the developer. Further, the cross section of the photoresist layer left pattern-wise after development should desirably be rectangular with the peripheral surfaces vertical to the surface of the substrate while conventional developer solutions usually give a trapezoidal cross section.

The rapid progress of the manufacturing technology of semiconductor integrated circuits in recent years requires finer and finer patterning of the photoresist layer on the substrate surface to obtain a resolving power of so-called submicron order. In particular, the quality and yield of acceptable products are greatly influenced by the performance of the development treatment in the patterned photoresist layer having open areas of a fineness of 1 $\mu$m or so or having contact holes. In this regard, conventional developer solutions cannot fully meet the requirements and improvements in the performance of the developer solution have been eagerly desired.

Various attempts and proposals have been hitherto made accordingly in the formulation of the developer solution including a developer solution which is a metal ion-free aqueous solution of a tetraalkyl ammonium hydroxide admixed with a surface active agent of the type of a quaternary ammonium compound such as methyl bis(2-hydroxy)coco-ammonium chloride and trimethyl coco-ammonium chloride as taught in Japanese Patent Kokai 58-9143 and a developer solution obtained by adding a surface active agent or an organic solvent to a conventional developer solution for positive-working photoresist compositions as taught in Japanese Patent Kokai 58-57128.

The above mentioned improvements in the formulation of the developer solution are all based on the mechanism that the admixture of the additives has an effect to increase the wettability of the photoresist layer to the developer solution so as to increase the efficiency of dissolution of the photoresist layer resulting in the improvements in the resolving power and the dimensional accuracy of the photoresist pattern. Though effective to some extent in the desired improvements in the resolving power and dimensional accuracy of the photoresist pattern, the developer solutions by the above mentioned improved formulation still have problems, in particular, when formation of a pattern having very fine open areas or contact holes is desired because scums or thin film residua of the photoresist layer are sometimes left on the areas exposed to the ultraviolet light despite the requirement that the photoresist layer should have been completely dissolved away from such areas resulting in a limited improvement of the resolving power in such fine patterning.

Although the above mentioned scums and film residua on the patterned photoresist layer can be removed by a short post-treatment of the patterned photoresist layer with oxygen plasma or sputtering [see, for example, S. M. Irving, Solid State Technology, volume 14, No. 6, page 47 (1971)], these procedures of post-treatment are practically not feasible because the forms of the resist pattern per se may be damaged unless the post-treatment is performed under well-controlled conditions in addition to the not always satisfactory efficiency for the uniform removal of the scums and film residua, in particular, in an extremely fine pattern with contact holes on the photoresist layer. Accordingly, it is eagerly desired to develop a method for the formation of an extremely fine photoresist pattern on a substrate surface from which the scums and film residua left after the development treatment have been efficiently and completely removed even in the areas of the finest pattern in order to comply with the demand in the semiconductor industry under rapid progress toward increased fineness.

SUMMARY OF THE INVENTION

Thus, the method of the present invention for forming a pattern-wise photoresist layer on the surface of a substrate comprises the steps of:

(a) forming a layer of a positive-working photoresist composition on the surface of a substrate;

(b) exposing the layer of the photoresist pattern-wise to actinic rays to increase the solubility of the photoresist on the areas exposed to the actinic rays;

(c) dissolving away the photoresist layer on the areas exposed to the actinic rays with a developer solution to leave a pattern-wise photoresist layer on the surface of the substrate; and (d) rinsing the substrate with the pattern-wise photoresist layer on the surface thereof with a scum-remover solution which is a mixture of an aqueous solution of a quaternary ammonium hydroxide and a water-miscible organic solvent.

In particular, the scum-remover solution used in the step (d) of the inventive method is a mixture of 100 parts by weight of an alkaline aqueous solution containing from 0.5 to 1.5% by weight of a quaternary ammonium hydroxide selected from the group consisting of tetraalkyl ammonium hydroxides and trialkyl hydroxyalkyl ammonium hydroxides, such as tetramethyl ammonium hydroxide and trimethyl 2-hydroxyethyl ammonium hydroxide, with from 1 to 30 parts by weight of a water-miscible organic solvent.

DETAILED DESCRIPTION OF THE PREFERRED EMBODIMENTS

As is understood from the above given summary of the invention, the most characteristic feature of the inventive method consists in the step (d) of rinsing the substrate bearing the pattern-wise photoresist layer on the surface thereof formed by the development treatment following the pattern-wise exposure of the photoresist layer to actinic rays by using a scum-remover solution of a specific formulation. By this means, the pattern-wise photoresist layer can be imparted with a greatly improved resolving power as a result of the complete removal of the scums left after the development treatment of the photoresist layer.

In the method of the present invention, the type of the positive-working photoresist composition, of which a resist layer is formed on the substrate surface, is not particularly limitative. Although any of conventional positive-working photoresist compositions can be used in the inventive method, particularly preferable photoresist compositions should contain, as the photosensitive ingredient thereof, a partially or completely esterified or amidated product of a quinonediazide group-containing compound such as the sulfonic acids of quinonediazides, e.g. o-benzoquinone diazide,o-naphthoquinone diazide and o-anthraquinone diazide, with a compound having a phenolic hydroxy group or an amino group in the molecule.

The compound having a phenolic hydroxy group or amino group in the molecule mentioned above is exemplified by polyhydroxy benzophenones, e.g. 2,3,4-trihydroxy benzophenone and 2,2',4,4'-tetrahydroxy benzophenone, alkyl gallates, aryl gallates, phenol, 4-methoxyphenol, dimethyl phenols, hydroquinone, bisphenol A, naphthols, pyrocatechol, pyrogallol, monomethyl ethers of pyrogallol, 1,3-dimethyl ether of pyrogallol, gallic acid, partial esterification or etherification products of gallic acid, aniline, 4-amino diphenyl amine and the like.

Besides the above mentioned photosensitive ingredient, the positive-working photoresist composition used in the inventive method should contain a film-forming resin which is exemplified by various kinds of alkali-soluble resins such as novolac resins obtained from a phenolic compound, e.g. phenol and cresol, and an aldehyde, acrylic resins, polyvinyl alcohols, poly(vinyl alkyl ethers), copolymers of styrene and acrylic acid, polymers of hydroxystyrene, poly(vinyl hydroxy benzoate), poly(hydroxy benzal) and the like.

The positive-working photoresist composition is used, preferably, in the form of a solution prepared by dissolving the above mentioned photosensitive ingredient and the film-forming resin in a suitable organic solvent.

The organic solvent usable for the preparation of the photoresist composition in the form of a solution is exemplified by ketones, e.g. acetone, methyl ethyl ketone, cyclohexanone and isoamyl ketone, polyhydric alcohols, e.g. ethylene glycol and diethylene glycol, and monoacetates thereof, e.g. ethylene glycol monoacetate and diethylene glycol monoacetate, as well as monoethers thereof, e.g. monomethyl ethers, monoethyl ethers, monopropyl ethers, monobutyl ethers and monophenyl ethers, cyclic ethers, e.g. dioxane, and esters, e.g. ethyl acetate and butyl acetate. These organic solvents can be used either singly or as a combination of two kinds or more according to need.

In the step (a) of the inventive method, the surface of a substrate material such as a semiconductor silicon wafer is uniformly coated with the positive-working photoresist composition in the form of a solution by a suitable coating means such as a spinner and doctor knife followed by drying to form a photoresist layer on the substrate surface.

In the step (b) of the inventive method, thereafter, the thus formed layer of the positive-working photoresist composition is exposed pattern-wise to actinic rays. For example, the photoresist layer is exposed pattern-wise through a photomask bearing the desired pattern to the ultraviolet light emitted from a light source such as low-pressure mercury lamps, high-pressure mercury lamps, ultrahigh-pressure mercury lamps, arc lamps, xenon lamps and the like. Alternatively, pattern-wise scanning with electron beams has a similar effect to the exposure to ultraviolet. By this exposure to actinic rays, the positive-working photoresist composition on the pattern-wise exposed areas of the resist layer is imparted with increased solubility.

The step (c) to follow is the development treatment of the thus formed latent image of the photoresist layer using a developer solution capable of dissolving the photoresist composition on the pattern-wise exposed areas imparted with increased solubility. The photoresist layer is dissolved away by this development treatment from the areas exposed to the actinic rays leaving a pattern-wise layer of the photoresist on the unexposed areas. The developer solution may be any of conventional ones used for the development of a positive-working photoresist layer without particular limitations although preferable developer solution are those containing a quaternary ammonium hydroxide as the alkalifying agent, such as tetraalkyl ammonium hydroxides and trialkyl hydroxyalkyl ammonium hydroxides, in a concentration of 2 to 7% by weight in water as the solvent. A particularly preferable developer solution is an aqueous solution of tetramethyl ammonium hydroxide or trimethyl 2-hydroxyethyl ammonium hydroxide.

The step (d) of the inventive method is a post-treatment of the above described development treatment of the photoresist layer using a specific scum-remover solution capable of dissolving away any small bit of the scums left in the patterned photoresist layer after the development treatment. The scum-remover solution used here is a mixture of an aqueous solution of a quaternary ammonium hydroxide and a water-miscible organic solvent in a specified concentration or proportion.

Suitable quaternary ammonium hydroxides include tetramethyl ammonium hydroxide, tetraethyl ammonium hydroxide, trimethyl ethyl ammonium hydroxide, dimethyl diethyl ammonium hydroxide, trimethyl 2-hydroxyethyl ammonium hydroxide, dimethyl di(2-hydroxyethyl) ammonium hydroxide and the like. These quaternary ammonium hydroxides can be used either singly or as a combination of two kinds or more according to need. Among the above named quaternary ammonium hydroxides, tetramethyl ammonium hydroxide and trimethyl 2-hydroxyethyl ammonium hydroxide are particularly preferred.

The concentration of the quaternary ammonium hydroxide in the aqueous solution should be in the range from 0.5 to 1.5% by weight or, preferably, from 0.7 to 1.3% by weight. When the concentration is too low, the velocity of dissolving the scums is greatly decreased. When the concentration thereof is too high, on the other hand, the mixed solution may have a dissolving power so high that not only the scums are dissolved away but also the patterned photoresist layer is more or less dissolved so that the fidelity of pattern reproduction is unduly decreased.

The aqueous solution of tetramethyl ammonium hydroxide or trimethyl 2-hydroxyethyl ammonium hydroxide is known as a developer solution for positive-working photoresist compositions. It should be noted that conventional developer solutions contain these quaternary ammonium hydroxide usually in a concentration of 2 to 7% by weight in order to fully exhibit the effect of development while the concentration of the quaternary ammonium hydroxide in the scum-remover solution should be much lower than the above mentioned concentration in the developer solutions.

The water-miscible organic solvent mixed with the above mentioned aqueous solution of the quaternary ammonium hydroxide to form the scum-remover solution is exemplified by ethyl alcohol, n-propyl alcohol, isopropyl alcohol, ethylene glycol monomethyl ether, ethylene glycol monoethyl ether, ethylene glycol monobutyl ether, acetone, methyl ethyl ketone, cyclohexanone, cyclopentanone, ethylene glycol monomethyl ether acetate, ethylene glycol monoethyl ether acetate and the like. The amount of the water-miscible organic solvent in the scum-remover solution should be in the range from 1 to 30 parts by weight or, preferably, from 4 to 20 parts by weight per 100 parts by weight of the aqueous solution of the quaternary ammonium hydroxide. When the amount of the water-miscible organic solvent is too small, no sufficient effect of scum removing can be obtained with the mixed solution. When the amount of the organic solvent is too large in the mixed solution, on the other hand, the mixed solution would exhibit dissolving power even to the patterned photoresist layer on the unexposed areas so that the fidelity in the pattern reproduction is more or less decreased. This is because the alkali-soluble resinous ingredient and the naphthoquinone diazide-based photosensitive ingredient in the photoresist composition are soluble in the above named water-miscible organic solvents. Therefore, the above specified proportion of the organic solvent to the aqueous solution is critical in order to ensure high fidelity of the pattern reproduction.

The procedure of the step (d), i.e. rinsing of the substrate bearing the patterned photoresist layer thereon with the above described scum-remover solution, may be performed by any convenient method including dipping method, spraying method, paddle method and the like. After the scums have been completely dissolved away, the substrate is thoroughly rinsed with water followed by drying. In this manner, the patterned photoresist layer formed on the substrate surface is imparted with greatly improved resolving characteristics without leaving any scums and film residua on the ultraviolet-exposed areas. It is sometimes advantageous that the development treatment in the step (c) is followed by rinse of the substrate with water prior to the treatment with the scum-remover solution so as to wash away the developer solution on the substrate surface as completely as possible with an object to avoid any undesirable influence of the developer solution on the fidelity of the reproduced photoresist pattern.

In the following, the method of the present invention is described in more detail by way of examples.

Example 1

A semiconductor silicon wafer of 4 inches diameter was coated with a positive-working photoresist composition (OFPR-5000, a product of Tokyo Ohka Kogyo Co.) by using a spinner to give a photoresist layer having a thickness of 1.3 $\mu$m as dried followed by drying on a hot plate at 110° C. for 90 seconds. The photoresist layer was then exposed pattern-wise to ultraviolet light through a test chart reticle on an apparatus for minifying projection (Model DSW 4800 manufactured by GCA Co.) followed by a development treatment in a paddle method at 23° C. for 25 seconds using a 2.38% by weight aqueous solution of tetramethyl ammonium hydroxide as the developer solution. Thereafter, the silicon wafer was subjected to a treatment of scum removal in the paddle method by use of a scum-remover solution at 23° C. for 20 seconds followed by thorough rinse with water and drying to finish the patterned photoresist layer on the substrate surface.

The scum-remover solution used here was a mixture of a 1.3% by weight aqueous solution of tetramethyl ammonium hydroxide and a water-miscible organic solvent indicated in Table 1 given below in an amount also indicated in the table in parts by weight per 100 parts by weight of the aqueous solution of tetramethyl ammonium hydroxide. Table 1 also shows the photosensitivity, which is given in m second of the minimum exposure time required for completely dissolving away the photoresist layer on the exposed areas, for each of the combinations of the development treatment and the scum removing treatment with the scum-remover solution containing the respective organic solvent.

When the development treatment was followed by the above described scum removing treatment, no residuum of scums was found in the open areas of the patterned photoresist layer having a thickness of 1 μm as well as in the contact holes of 1.3 μm. When the scum removing treatment following the development treatment was omitted, on the other hand, scum residua were found on both of the open areas and the contact holes of the patterned photoresist layer. The photosensitivity when the scum removing treatment was omitted was 120 m seconds.

TABLE 1

| Organic solvent | | |
| --- | --- | --- |
| Solvent | Amount added, parts by weight | Photosensitivity, m seconds |
| Isopropyl alcohol | 10 | 130 |
| Isopropyl alcohol | 15 | 110 |
| Ethyl alcohol | 10 | 150 |
| Ethyl alcohol | 20 | 120 |
| Ethylene glycol monoethyl ether | 10 | 130 |
| Ethylene glycol monomethyl ether | 10 | 130 |
| Ethylene glycol monomethyl ether | 15 | 100 |
| Ethylene glycol monobutyl ether | 10 | 130 |
| Methyl ethyl ketone | 4 | 130 |
| Methyl ethyl ketone | 5 | 120 |
| Cyclohexanone | 4 | 130 |
| Cyclohexanone | 5 | 120 |
| Cyclopentanone | 4 | 120 |

Example 2

The procedure for pattern formation of a photoresist layer on a number of semiconductor silicon wafers was substantially the same as in Example 1 except that the time for the development treatment was varied and the scum removing treatment was performed for varied lengths of time using a scum-remover solution which was a mixture of 100 parts by weight of a 1.3% by weight aqueous solution of tetramethyl ammonium hydroxide and 15 parts by weight of isopropyl alcohol. Table 2 below shows the photosensitivity in m seconds in each of the experiments with varied lengths of the development time and the scum removing time as well as the completeness of scum removing found by the electron microscopic examination of an open areas of 1 μm width in the patterned photoresist layer, of which the ratings A, B and C correspond to absolute absence of scum residua, small amount of scum residua and large amount of scum residua, respectively.

TABLE 2

| Treatment time, seconds | | Photosensitivity, | |
| --- | --- | --- | --- |
| Development | Scum removing | m seconds | Scum residua |
| 45 | 0 | 130 | C |
| 40 | 5 | 130 | B-A |
| 35 | 10 | 130 | A |
| 25 | 20 | 135 | A |
| 15 | 30 | 140 | A |
| 10 | 35 | 140 | A |
| 0 | 45 | 280 | A |

What is claimed is:

1. A method for forming a pattern-wise photoresist layer on the surface of a substrate which comprises the steps of:
    (a) forming a layer of photo-working photoresist composition on the surface of a substrate;
    (b) exposing the layer of the positive-working photoresist pattern-wise to actinic rays to increase the solubility of the photoresist composition on the areas exposed to the actinic rays;
    (c) dissolving away the layer of the photoresist composition on the areas exposed to the actinic rays with a developer solution to leave a pattern-wise photoresist layer on the surface of the substrate; and
    (d) rinsing the substrate with the pattern-wise photoresist layer on the surface thereof with a scum-remover solution which is a mixture of 100 parts by weight of an aqueous solution of from 0.5 to 1.5% by weight of tetramethylammonium hydroxide or trimethyl 2-hydroxymethyl ammonium hydroxide, and from 1 to 30 parts by weight of a water-miscible organic solvent.

2. The method for forming a pattern-wise photoresist layer on the surface of a substrate as claimed in claim 1 wherein the water-miscible organic solvent is selected from the group consisting of ethyl alcohol, n-propyl alcohol, isopropyl alcohol, ethylene glycol monomethyl ether, ethylene glycol monoethyl ether, ethylene glycol monobutyl ether, acetone, methyl ethyl ketone, cyclohexanone, cyclopentanone, ethylene glycol monomethyl ether acetate and ethylene glycol monoethyl ether acetate.

3. The method of forming a pattern-wise photoresist layer on the surface of a substrate as claimed in claim 1 wherein the developer solution is an aqueous solution containing from 2 to 7% by weight of a quaternary ammonium hydroxide.

* * * * *

UNITED STATES PATENT AND TRADEMARK OFFICE
CERTIFICATE OF CORRECTION

PATENT NO. : 4,873,177

DATED : October 10, 1989

INVENTOR(S) : Tanaka Hatsuyuki et al.

It is certified that error appears in the above-identified patent and that said Letters Patent is hereby corrected as shown below:

Column 8, line 23 reading:

"(a) forming a layer of photo-working photoresist"

should read:

-- (a) forming a layer of positive-working photoresist --.

Column 8, line 53 reading:

"3. The method of forming a pattern-wise photoresist"

should read:

-- 3. The method for forming a pattern-wise photoresist --.

Signed and Sealed this

Second Day of October, 1990

*Attest:*

HARRY F. MANBECK, JR.

*Attesting Officer*     *Commissioner of Patents and Trademarks*